United States Patent
Huang et al.

(10) Patent No.: US 9,070,897 B2
(45) Date of Patent: Jun. 30, 2015

(54) DISPLAY PANEL

(75) Inventors: Yen-Shih Huang, Hsin-Chu (TW); Chia-Yuan Yeh, Hsin-Chu (TW); Bo-Feng Lee, Hsin-Chu (TW); Ta-Wei Chiu, Hsin-Chu (TW)

(73) Assignee: AU Optronics Corp., Science-Based Industrial Park, Hsin-Chu (TW)

(*) Notice: Subject to any disclaimer, the term of this patent is extended or adjusted under 35 U.S.C. 154(b) by 387 days.

(21) Appl. No.: 13/471,480

(22) Filed: May 15, 2012

(65) Prior Publication Data

US 2013/0044046 A1  Feb. 21, 2013

(30) Foreign Application Priority Data

Aug. 15, 2011 (TW) ............... 100129073 A

(51) Int. Cl.
*H01L 27/12* (2006.01)
*H01L 51/52* (2006.01)
*H01L 27/32* (2006.01)

(52) U.S. Cl.
CPC .......... *H01L 51/524* (2013.01); *H01L 27/3258* (2013.01); *H01L 27/3276* (2013.01)

(58) Field of Classification Search
CPC ................................. H01L 27/1214
USPC .......................................... 257/59
See application file for complete search history.

(56) References Cited

U.S. PATENT DOCUMENTS

| 6,737,799 | B1 | 5/2004 | Lih | |
|---|---|---|---|---|
| 7,795,803 | B2 | 9/2010 | Kim | |
| 2004/0069987 | A1 | 4/2004 | Yoneda | |
| 2008/0170190 | A1* | 7/2008 | Lan et al. ............... | 349/122 |
| 2010/0066232 | A1* | 3/2010 | Kim et al. ............... | 313/317 |
| 2011/0134056 | A1* | 6/2011 | Kim et al. ............... | 345/173 |
| 2011/0163329 | A1* | 7/2011 | Kim et al. ............... | 257/88 |

FOREIGN PATENT DOCUMENTS

| CN | 1481199 A | 3/2004 |
|---|---|---|
| CN | 1505165 A | 6/2004 |

* cited by examiner

*Primary Examiner* — Matthew W Such
*Assistant Examiner* — Warren H Kilpatrick
(74) *Attorney, Agent, or Firm* — Winston Hsu; Scott Margo

(57) ABSTRACT

A display panel includes a substrate, a TFT device, a patterned dielectric layer, a patterned metal layer and a bridge line. The TFT device is disposed in a display region. The patterned dielectric layer includes an ILD layer disposed over the TFT device, and a sealant stage disposed in a peripheral region. The patterned metal layer includes a signal line disposed on the ILD layer, and a first connecting line and a second connecting line. The first connecting line is disposed in an inner side of the sealant stage facing the display region, and the first connecting line is electrically connected to the signal line. The second connecting line is disposed in an outer side of the sealant stage opposite to the display region. The bridge line is disposed under the sealant stage, and the first connecting line and the second connecting line are electrically connected through the bridge line.

19 Claims, 5 Drawing Sheets

DISPLAY PANEL

BACKGROUND OF THE INVENTION

1. Field of the Invention

The present invention relates to a display panel, and more particularly, to a display panel including an inter-layered dielectric (ILD) layer and a sealant stage made of the same patterned dielectric layer.

2. Description of the Prior Art

A display panel generally includes an array substrate, an encapsulation substrate, a light-emitting array formed on the array substrate, and a sealant formed between the array substrate and the encapsulation substrate to bond the array substrate and the encapsulation substrate. In a conventional display panel, the sealant is required to be cured by laser irradiation for providing adhesion between the array substrate and the encapsulation substrate. Heat, however, will generate during laser irradiation. To prevent the devices formed in the array substrate under the sealant from being damaged by heat, a material layer e.g. an inorganic material layer served as a sealant stage that can resist high temperature is required. Accordingly, an extra photolithography process for fabricating the sealant stage is required. This extra photolithography process would increase fabrication cost, which is unfavorable for development of electroluminescent display panel.

SUMMARY OF THE INVENTION

It is therefore one of the objectives of the present invention to provide a display panel for reducing fabrication cost and improve reliability.

According to a preferred embodiment, a display panel is provided. The display panel includes a substrate, at least one thin film transistor device, a patterned dielectric layer, and at least one bridge line. The substrate has a display region and a peripheral region. The thin film transistor device is disposed in the display region. The patterned dielectric layer includes an inter-layered dielectric (ILD) layer, disposed in the display region and over the thin film transistor device, and a sealant stage disposed in the peripheral region and surrounding the display region. The patterned metal layer includes at least one signal line disposed on the ILD layer in the display region, and at least one first connecting line and at least one second connecting line disposed in the peripheral region. The first connecting line is disposed in an inner side of the sealant stage facing the display region and electrically connected to the signal line, and the second connecting line is disposed in an outer side of the sealant stage opposite to the display region. The bridge line is disposed in the peripheral region. The bridge line being disposed at least under the sealant stage, and the first connecting line and the second connecting line are electrically connected to each other through the bridge line.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
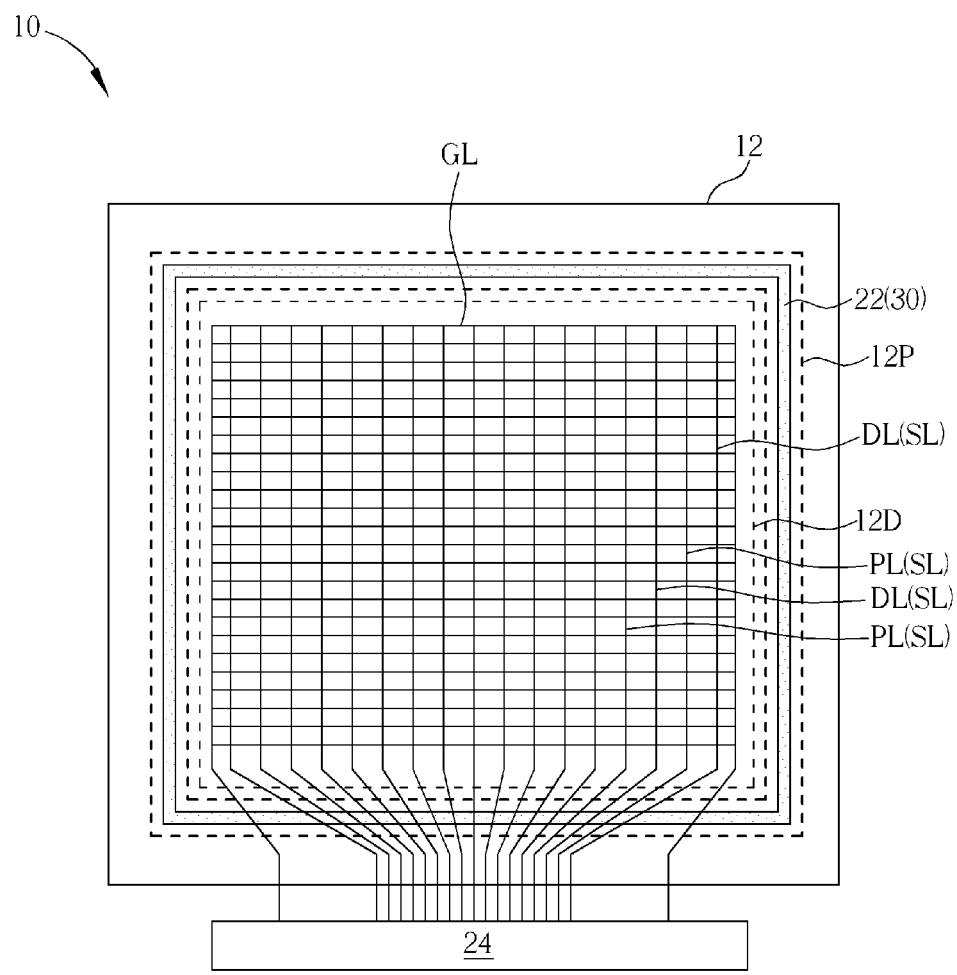
FIG. 1 illustrates a top view of a display panel according to a first preferred embodiment of the present invention.
Figure 2:
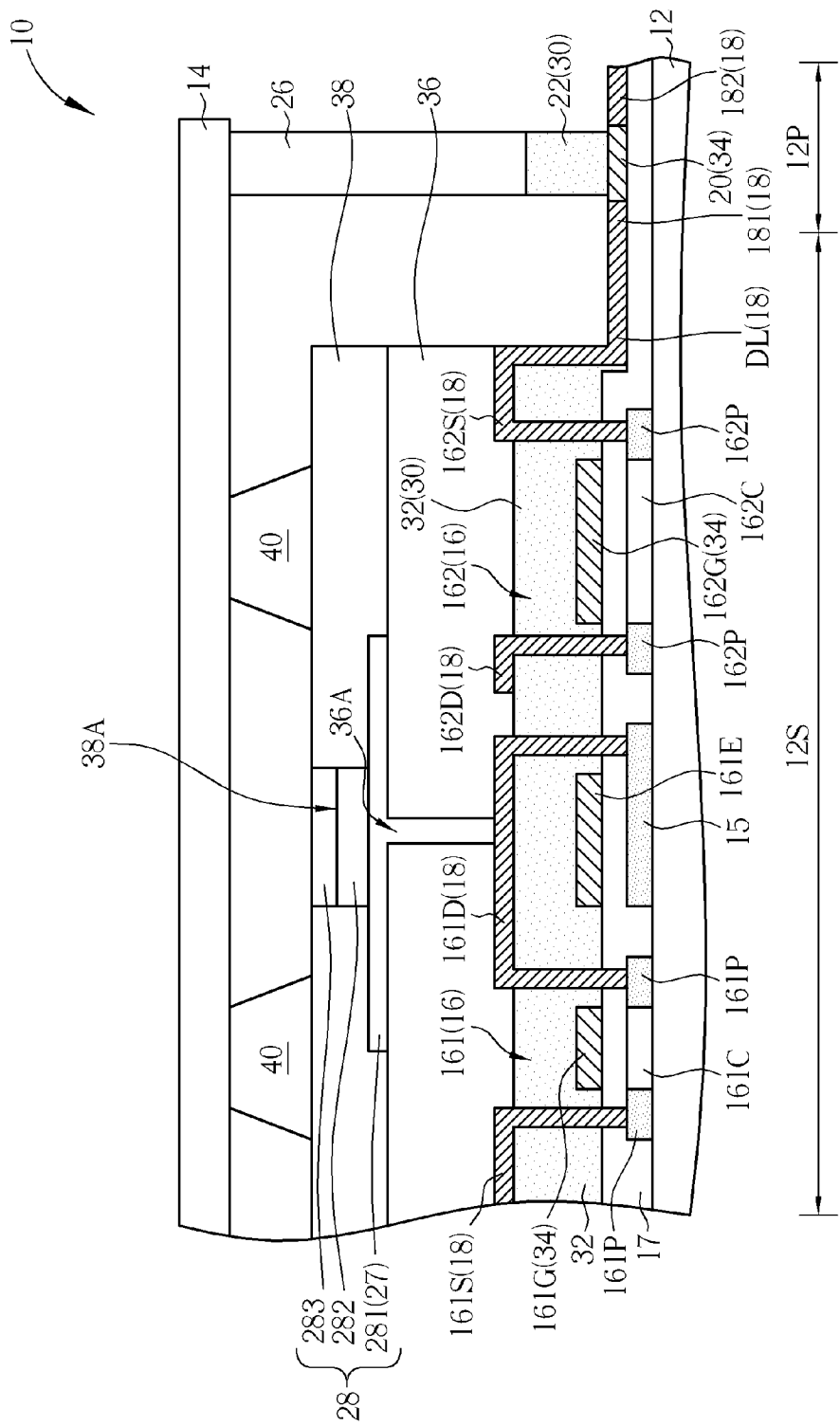
FIG. 2 illustrates a cross-sectional view of a display panel according to a first preferred embodiment of the present invention.

Please refer to FIG. 1 and FIG. 2. FIG. 1 illustrates a top view of a display panel according to a first preferred embodiment of the present invention, and FIG. 2 illustrates a cross-sectional view of a display panel according to a first preferred embodiment of the present invention. To highlight the features of the display panel of the present embodiment, some parts of the display panel are not drawn in FIG. 1 or FIG. 2. As shown in FIG. 1 and FIG. 2, the display panel 10 of this embodiment includes a substrate 12, an encapsulation substrate 14, a plurality of signal lines SL, a plurality of thin film transistor (TFT) devices 16, at least one first connecting line 181, at least one second connecting line 182, at least one bridge line 20, a sealant stage 22, a circuit board 24, a sealant 26 and a plurality of light-emitting devices 28. The substrate 12 may be, for example, a transparent substrate, and has a display region 12D and a peripheral region 12P surrounding the display region 12D. The encapsulation substrate 14 is disposed opposite to the substrate 12. In this embodiment, the signal lines SL may include a plurality of data lines DL and power lines PL disposed in the display region 12D of the substrate 12, and the data lines DL and the power lines PL may be made of the same patterned metal layer, and arranged alternately. The display panel 10 further includes a plurality of gate lines GL, which can be made of another patterned metal layer, and the gate lines GL and the data lines DL intersect with each other, defining a plurality of pixel regions 12S (as shown in FIG. 2) in the display region 12D. The sealant stage 22 is disposed in the peripheral region 12P of the substrate 12 and surrounding the display region 12D. The first connecting line 181 and the second connecting line 182 are disposed in the peripheral region 12P, and the first connecting line 181 is disposed in an inner side of the sealant stage 22 facing the display region 12D and electrically connected to the signal line SL. In this embodiment, the first connecting line 181, for instance, is electrically connected to the data lines DL, but not limited thereto. The first connecting line 181 may be electrically connected to the power lines PL. The second connecting line 181 is disposed in an outer side of the sealant stage 22 opposite to the display region 12D, and the second connecting line 182 may be electrically connected to a driving IC (not shown) disposed on the circuit board 24. The circuit board 24 may be for example a flexible printed circuit (FPC), but not limited thereto. The bridge line 20 is disposed in the peripheral region 12P of the substrate 12, and disposed at least under the sealant stage 22. The first connecting line 181 and the second connecting line 182 are electrically connected to each other through the bridge line 20. The light-emitting devices 28 are disposed in the pixel regions 12S of the display region 12D, respectively. The sealant stage 22 is disposed on the surface of the bridge line 20. The sealant 26 is disposed on the sealant stage 22 and in contact with the encapsulation substrate 14 to bond the substrate 12 and the encapsulation substrate 14. The sealant 26 can block water and oxygen existing in the environment from invading the internal of the display panel 10, and thus extends lifetime of the display panel 10. In this embodiment, the sealant 26 may be e.g. glass frit, a mixture of silicon oxide and polymer material. The glass frit may be cured by laser irradiation, which can isolate water and oxygen and provide adhesion after curing. The material of the sealant 26, however, is not limited.

The display panel 10 of this embodiment may be an electroluminescent display panel, e.g. an organic light-emitting diode (OLED) display panel, but not limited thereto. In this embodiment, the sealant stage 22 is part of a patterned dielectric layer 30, and the patterned dielectric layer 30 may further include an inter-layered dielectric (ILD) layer 32 disposed in the display region 12D and over the TFT devices 16. The patterned dielectric layer 30 is preferable made of a high temperature resistant material, such as an inorganic dielectric material e.g. silicon oxide, silicon nitride or silicon oxynitride, but not limited thereto. In each pixel region 12S of the display panel 10, a switching TFT device 162 and a driving TFT device 161 may be disposed. The switching TFT device 162 may be, for instance, an N type TFT device. The switching TFT device 162 includes a semiconductor channel layer 162C disposed on the substrate 12, two doped layers 162P disposed on the substrate 12 and corresponding to two opposite sides of the semiconductor channel layer 162C, a gate insulating layer 17 disposed on the substrate 12, the semiconductor channel layer 162C and the doped layers 162P, a gate electrode 162G disposed on the gate insulating layer 17, and two source/drain electrodes 162S, 162D disposed on the ILD layer 32 and electrically connected to the doped layers 162P, respectively. In addition, the driving TFT device 161 may be, for instance, a P type TFT device. The driving TFT device 161 includes a semiconductor channel layer 161C disposed on the substrate 12, two doped layers 161P disposed on the substrate 12 and corresponding to two opposite sides of the semiconductor channel layer 161C, a gate insulating layer 17 disposed on the substrate 12, the semiconductor channel layer 161C and the doped layers 161P, a gate electrode 161G disposed on the gate insulating layer 17, and two source/drain electrodes 161S, 161D disposed on the ILD layer 32 and electrically connected to the doped layers 161P, respectively. The gate electrode 162G of the switching TFT device 162 is electrically connected to the gate line GL (not shown in FIG. 2), one end of the data line DL is electrically connected to the source/drain electrode 162S, the other end of the data line DL is electrically connected to the first connecting line 181, and the source/drain electrode 162D is electrically connected to the gate electrode 161G of the driving TFT device 161. The source/drain electrode 161S of the driving TFT device 161 is electrically connected to the power line PL (not shown in FIG. 2), and the source/drain electrode 161D is electrically connected to the light-emitting device 28. In addition, The source/drain electrode 161D may be further electrically connected to a storage electrode 15, the gate electrode 161G may have an extension electrode 161E, which forms a storage capacitor with the storage electrode 15. The light-emitting device 28 may be an electroluminescent device e.g. an organic light-emitting diode (OLED) device, including a first electrode 281, a light-emitting layer 282 and a second electrode 283, where the first electrode 281 is electrically connected to the source/drain electrode 161D. In this embodiment, the first electrode 281 is a transparent electrode, e.g. an ITO electrode, and the first electrode 281 is made of a patterned transparent conductive layer 27.

At least one passivation layer e.g. a first passivation layer 36 and a second passivation layer 38 may be further disposed on the ILD layer 32. The material of the first passivation layer 36 and the second passivation layer 38 is preferably organic material, which has leveling effect. The first passivation layer 36 may have an opening 36A exposing the source/drain electrode 161D, and therefore the first electrode 281 of the light-emitting device 28 may be electrically connected to the source/drain electrode 161D through the opening 36A. The second passivation layer 38, disposed on the first passivation layer 36, has an opening 38A exposing the first electrode 281, and thus the light-emitting layer 282 and the second electrode 283 disposed in the opening 38A can be electrically connected to the first electrode 281. In addition, spacers 40 may be disposed on the second passivation layer 38 for maintaining a constant gap between the substrate 12 and the encapsulation substrate 14.

In this embodiment, the TFT device 16 (including the switching TFT device 162 and the driving TFT device 161) is a top gate type TFT device, but not limited thereto. Also, the data lines DL, the power lines PL, the source/drain electrodes 162S, 162D, the source/drain electrodes 161S, 161D, the first connecting line 181 and the second connecting line 182 may be made of a patterned metal layer 18 e.g. a second metal layer (metal 2, M2), and the patterned metal layer 18 is disposed on the patterned dielectric layer 30. In addition, the gate lines GL, the gate electrode 162G, the gate electrode 161G and the bridge line 20 may be made of another patterned metal layer 34 e.g. a first metal layer (metal 1, M1), and the patterned metal layer 34 is disposed under the patterned dielectric layer 30.

In this embodiment, the sealant stage 22 of the display panel 10 serves as a landing platform for the sealant 26. Since the sealant stage 22 and the ILD layer 32 are made of the same film layer, i.e. the same patterned dielectric layer 30, no extra process is required. Also, the material of the sealant stage 22 is high temperature resistant material e.g. inorganic dielectric material, and thus the sealant stage 22 would not be damaged during laser irradiation. In addition, the first connecting line 181 and the second connecting line 182 are formed subsequent to formation of the sealant stage 22, and the first connecting line 181 and the second connecting line 182 are not disposed on the surface of the sealant stage 22; thus, the conductivity of the first connecting line 181 and the second connecting line 182 would not be affected by heat when the sealant stage 22 is cured by laser irradiation. The electrical connection between the first connecting line 181 and the second connecting line 182 is achieved through the bridge line 20 disposed under the sealant stage 22, and the bridge line 20, the first connecting line 181 and the second connecting line 182 are disposed on the same plane. The bridge line 20, the gate lines GL the gate electrode 162G and the gate electrode 161G are made of the patterned metal layer 34, and thus no extra process is required.

The display panel of the present invention is not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 3:
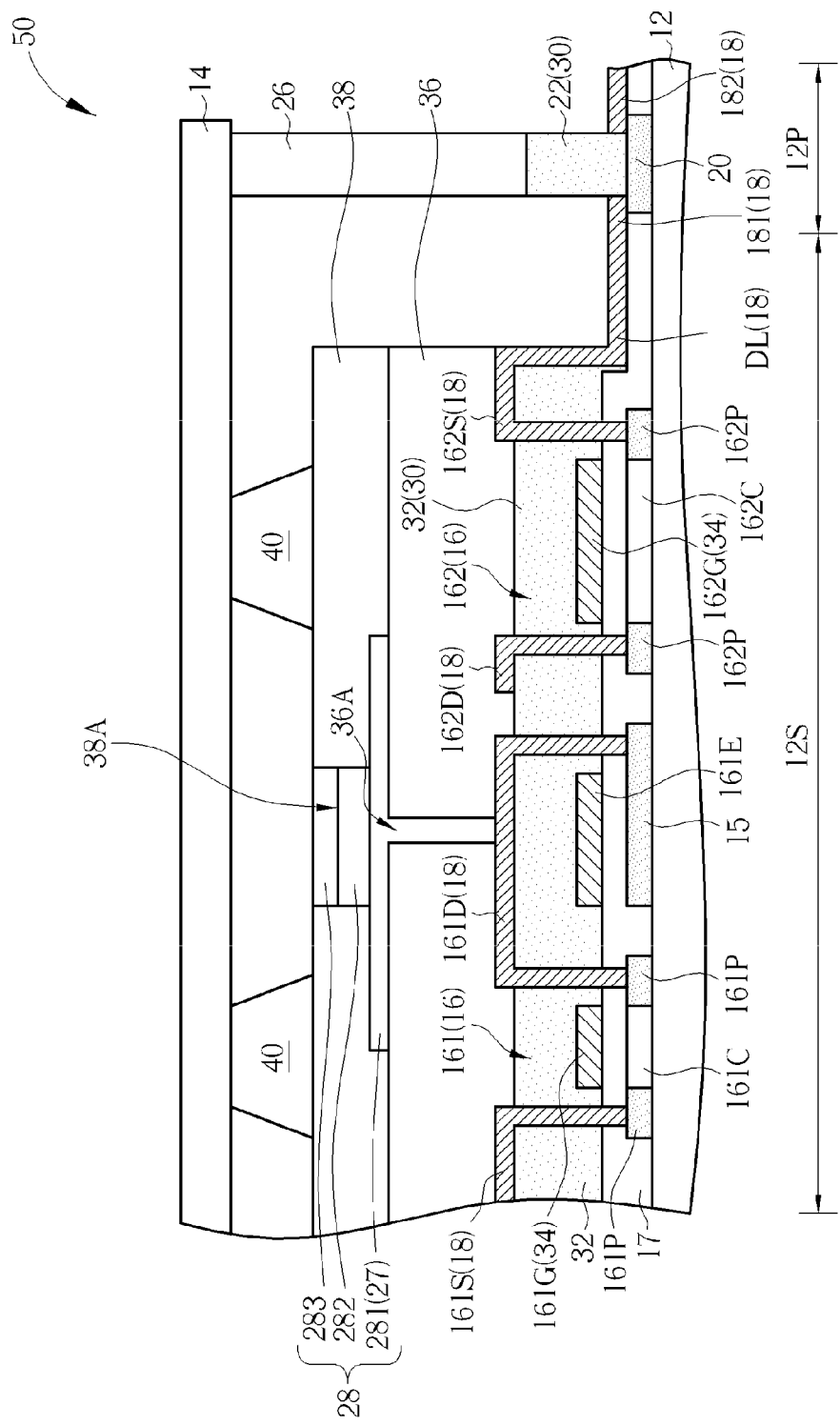
FIG. 3 is a schematic diagram illustrating a display panel according to a second preferred embodiment of the present invention.

Please refer to FIG. 3, along with FIG. 1. FIG. 3 is a schematic diagram illustrating a display panel according to a second preferred embodiment of the present invention. As shown in FIG. 3, different from the aforementioned embodiment, the bridge line 20 of the display panel 50 in this embodiment is not made of a patterned metal layer, but made of the same patterned doped layer as the doped layers 162P of the switching TFT device 162 and the doped layers 161P of the driving TFT device 161. In addition, the present embodiment can be integrated into the aforementioned embodiment, i.e. the bridge line 20 may be a composite-layered bridge line formed by stacking the patterned doped layer with the patterned metal layer.

Figure 4:
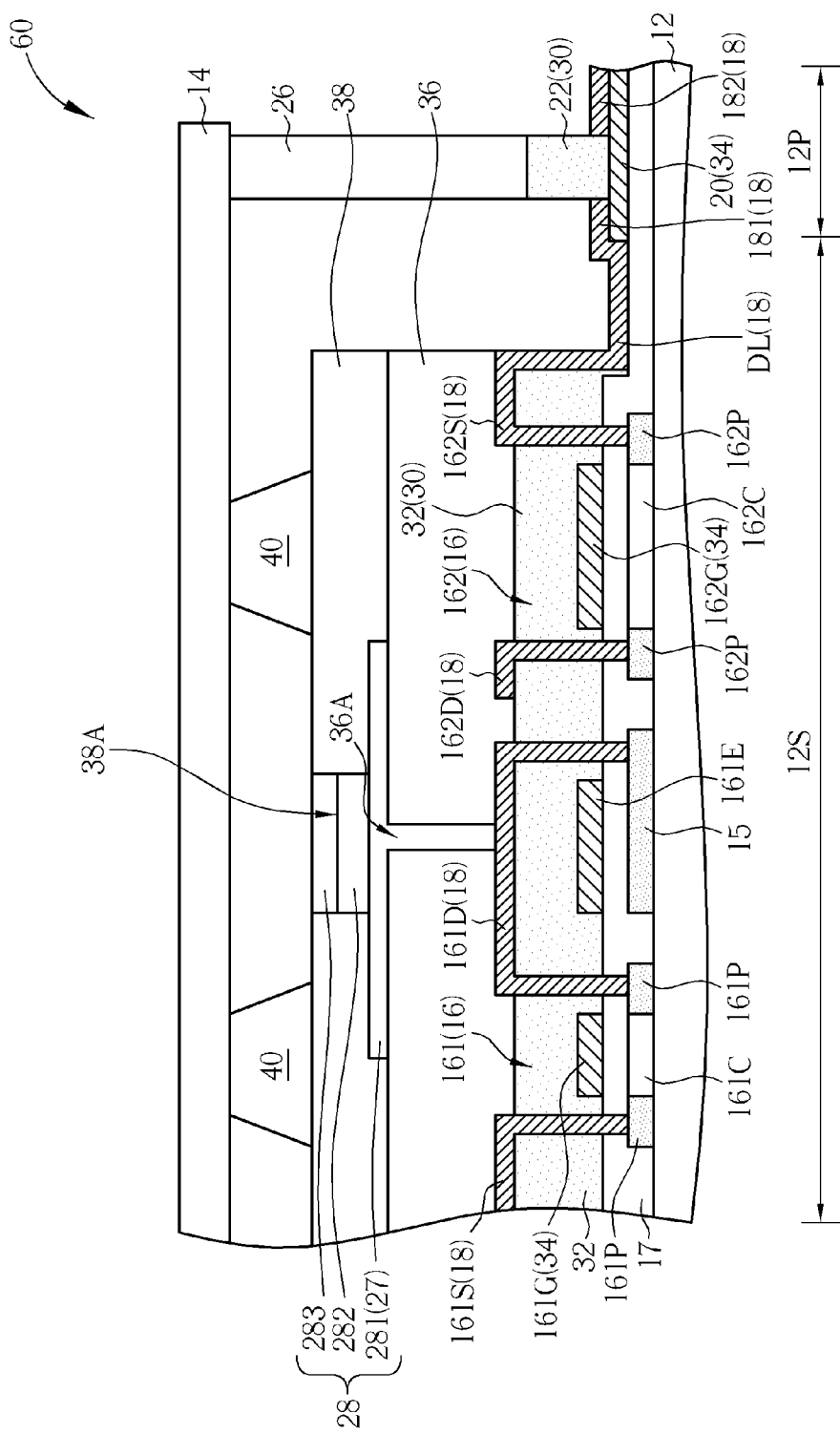
FIG. 4 is a schematic diagram illustrating a display panel according to a third preferred embodiment of the present invention.

Please refer to FIG. 4, along with FIG. 1. FIG. 4 is a schematic diagram illustrating a display panel according to a third preferred embodiment of the present invention. As shown in FIG. 4, different from the aforementioned embodiment, the bridge line 20 of the display panel 60 in this embodiment is substantially disposed under and corresponding to the sealant stage 22, and further extends to the underneath of the first connecting line 181 and the second connecting line 182. Accordingly, the bridge line 20 and the first connecting line 181/the second connecting line 182 have greater contact area, which can reduce resistance.

Figure 5:
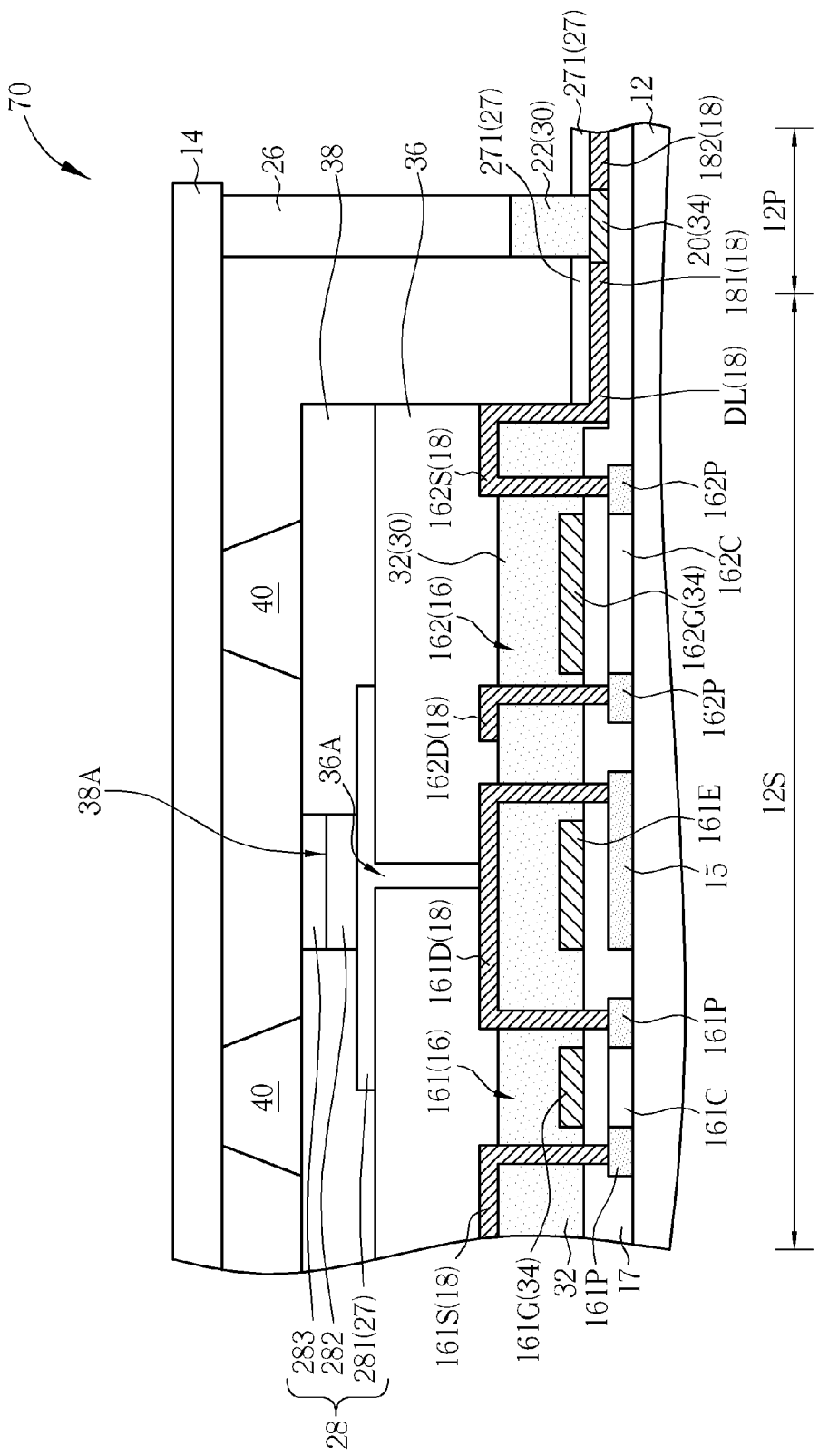
FIG. 5 is a schematic diagram illustrating a display panel according to a fourth preferred embodiment of the present invention.

Please refer to FIG. 5, along with FIG. 1. FIG. 5 is a schematic diagram illustrating a display panel according to a fourth preferred embodiment of the present invention. As shown in FIG. 5, different from the aforementioned embodiment, in this embodiment, the display panel 70 further includes a transparent conductive pattern 271 disposed over the first connecting line and the second connecting line 182 in the peripheral region 12P. The transparent conductive pattern 271 exposes the sealant stage 22, and electrically connects with the first connecting line and the second connecting line 182. The transparent conductive pattern 271 is preferably made of the same patterned transparent conductive layer 27 as the first electrode 271 for no extra process being required. The transparent conductive pattern 271 covers the first connecting line and the second connecting line 182, which prevents the first connecting line and the second connecting line 182 made of metal from being oxidized or eroded. Thus, the conductivity of the first connecting line and the second connecting line 182 is ensured. In addition, the transparent conductive pattern 271 may further cover the data lines DL.

The display panel of the present invention is not limited to an electroluminescent display panel, and may be any other types of display panels such as liquid crystal display (LCD) panel.

In conclusion, the sealant stage of the display panel serves as a landing platform for the sealant. Since the sealant stage and the ILD layer are made of the same patterned dielectric layer, no extra process is required. Also, the material of the sealant stage is high temperature resistant material e.g. inorganic dielectric material, and thus the sealant stage would not be damaged during laser irradiation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display panel, comprising:
 a substrate, having a display region and a peripheral region;
 at least one thin film transistor device, disposed in the display region;
 a patterned dielectric layer, comprising:
   an inter-layered dielectric (ILD) layer, disposed in the display region and over the thin film transistor device; and
   a sealant stage, disposed in the peripheral region and surrounding the display region;
 a patterned metal layer, comprising:
   at least one signal line, disposed on the ILD layer in the display region; and
   at least one first connecting line and at least one second connecting line, disposed in the peripheral region, the first connecting line being disposed in an inner side of the sealant stage facing the display region and electrically connected to the signal line, and the second connecting line being disposed in an outer side of the sealant stage opposite to the display region;
 at least one bridge line, disposed in the peripheral region, the bridge line being disposed at least under the sealant stage, wherein the first connecting line and the second connecting line are electrically connected to each other through the bridge line;
 an encapsulation substrate, disposed opposite to the substrate; and
 a sealant disposed on the sealant stage so that the sealant is not in direct physical contact with the bridge line, wherein the sealant is in direct physical contact with the sealant stage.

2. The display panel of claim 1, wherein the bridge line is further disposed under the first connecting line and the second connecting line.

3. The display panel of claim 1, wherein the thin film transistor device comprises a top gate type thin film transistor device.

4. The display panel of claim 1, wherein the thin film transistor device comprises:
 a semiconductor channel layer, disposed on the substrate;
 two doped layers, disposed on the substrate and corresponding to two opposite sides of the semiconductor channel layer;
 a gate insulating layer, disposed on the substrate, the semiconductor channel layer and the doped layers;
 a gate electrode, disposed on the gate insulating layer; and
 two source/drain electrodes, disposed on the ILD layer and electrically connected to the doped layers, respectively.

5. The display panel of claim 4, wherein the source/drain electrodes are made of the patterned metal layer, and the bridge line and the gate electrode are made of another patterned metal layer.

6. The display panel of claim 4, wherein the bridge line and the doped layers are made of a patterned doped layer.

7. The display panel of claim 1, further comprising:
 a passivation layer, disposed on the ILD layer and the source/drain electrodes; and
 a light-emitting device, disposed on the passivation layer, wherein the light-emitting device comprises a transparent electrode.

8. The display panel of claim 7, further comprising a transparent conductive pattern disposed on the first connecting line and the second connecting line in the peripheral region, wherein the transparent conductive pattern exposes the sealant stage, and electrically connects with the first connecting line and the second connecting line.

9. The display panel of claim 8, wherein the transparent electrode and the transparent conductive pattern are made of a patterned transparent conductive layer.

10. The display panel of claim 1, wherein the patterned dielectric layer comprises an inorganic dielectric layer, and the ILD layer and the sealant stage are made of a same film layer.

11. The display panel of claim 1, wherein the sealant comprises a glass frit.

12. The display panel of claim 1, wherein the sealant stage is located between the sealant and the patterned metal layer, and the peripheral region surrounds the display region.

13. The display panel of claim 1, wherein a material of the sealant stage comprises silicon oxide, silicon nitride or silicon oxynitride.

14. The display panel of claim 1, wherein a material of the patterned dielectric layer comprises silicon oxide, silicon nitride or silicon oxynitride.

15. The display panel of claim 4, wherein the bridge line is a composite-layered bridge line formed by stacking another doped layer with another patterned metal layer, the another doped layer of the composite-layered bridge line and the two doped layers of the thin film transistor device belong to a same doped layer, and the another patterned metal layer of composite-layered bridge line and the gate electrode of the thin film transistor device belong to a same metal layer.

16. The display panel of claim 1, wherein the sealant does not overlap the first connecting line and the second connecting line in a vertical projection direction.

17. A display panel, comprising:
a substrate, having a display region and a peripheral region;
at least one thin film transistor device, disposed in the display region, wherein the thin film transistor device comprises two doped layers disposed on the substrate;
a patterned dielectric layer, comprising:
an inter-layered dielectric (ILD) layer, disposed in the display region and over the thin film transistor device; and
a sealant stage, disposed in the peripheral region and surrounding the display region;
a patterned metal layer, comprising:
at least one signal line, disposed on the ILD layer in the display region; and
at least one first connecting line and at least one second connecting line, disposed in the peripheral region, the first connecting line being disposed in an inner side of the sealant stage facing the display region and electrically connected to the signal line, and the second connecting line being disposed in an outer side of the sealant stage opposite to the display region; and
at least one bridge line, disposed in the peripheral region, the bridge line being disposed at least under the sealant stage, wherein the first connecting line and the second connecting line are electrically connected to each other through the bridge line, and the bridge line and the doped layers are made of a same patterned doped layer.

18. A display panel, comprising:
a substrate, having a display region and a peripheral region;
at least one thin film transistor device, disposed in the display region, wherein the thin film transistor device comprises a gate electrode and two first doped layers disposed on the substrate;
a patterned dielectric layer, comprising:
an inter-layered dielectric (ILD) layer, disposed in the display region and over the thin film transistor device; and
a sealant stage, disposed in the peripheral region and surrounding the display region;
a first patterned metal layer, comprising:
at least one signal line, disposed on the ILD layer in the display region; and
at least one first connecting line and at least one second connecting line, disposed in the peripheral region, the first connecting line being disposed in an inner side of the sealant stage facing the display region and electrically connected to the signal line, and the second connecting line being disposed in an outer side of the sealant stage opposite to the display region; and
at least one bridge line, disposed in the peripheral region, the bridge line being disposed at least under the sealant stage, wherein the first connecting line and the second connecting line are electrically connected to each other through the bridge line, the bridge line is a composite-layered bridge line formed by stacking a second doped layer with a second patterned metal layer, and the second patterned metal layer and the gate electrode are formed by a same metal layer.

19. A display panel, comprising:
a substrate, having a display region and a peripheral region;
at least one thin film transistor device, disposed in the display region;
a patterned dielectric layer, comprising:
an inter-layered dielectric (ILD) layer, disposed in the display region and over the thin film transistor device; and
a sealant stage, disposed in the peripheral region and surrounding the display region;
a patterned metal layer, comprising:
at least one signal line, disposed on the ILD layer in the display region; and
at least one first connecting line and at least one second connecting line, disposed in the peripheral region, the first connecting line being disposed in an inner side of the sealant stage facing the display region and electrically connected to the signal line, and the second connecting line being disposed in an outer side of the sealant stage opposite to the display region;
at least one bridge line, disposed in the peripheral region, the bridge line being disposed at least under the sealant stage, wherein the first connecting line and the second connecting line are electrically connected to each other through the bridge line;
an encapsulation substrate, disposed opposite to the substrate; and
a sealant disposed between the sealant stage and the encapsulation substrate, wherein the sealant does not overlap the first connecting line and the second connecting line in a vertical projection direction.

* * * * *